United States Patent [19]

Lake et al.

[11] Patent Number: 4,915,983
[45] Date of Patent: Apr. 10, 1990

[54] MULTILAYER CIRCUIT BOARD FABRICATION PROCESS

[75] Inventors: Harold Lake, Sharon; Paul E. Grandmont, Franklin, both of Mass.

[73] Assignee: The Foxboro Company, Foxboro, Mass.

[21] Appl. No.: 742,747

[22] Filed: Jun. 10, 1985

[51] Int. Cl.$^4$ .................... B05D 5/12; H05K 3/06; H05K 3/42; H05K 3/46

[52] U.S. Cl. .................... 427/98; 427/97; 427/98; 29/831; 29/852; 156/901; 156/150; 156/280; 156/643; 156/902; 430/311; 430/312; 430/313; 430/314; 430/316; 430/317; 430/318

[58] Field of Search ............ 427/97, 98; 430/312, 430/311, 316, 313, 314, 317, 318; 29/831, 852; 156/902, 150, 901, 280, 643

[56] References Cited

U.S. PATENT DOCUMENTS

| | | | |
|---|---|---|---|
| 3,350,498 | 10/1967 | Leeds | 427/98 |
| 3,352,730 | 11/1967 | Murch, Jr. | 156/3 |
| 3,471,631 | 10/1969 | Quintana | 174/68.5 |
| 3,922,479 | 11/1975 | Older et al. | 174/68.5 |
| 4,054,479 | 10/1977 | Peiffer | 156/280 |
| 4,054,483 | 10/1977 | Peiffer | 156/632 |
| 4,118,523 | 10/1978 | Bingham et al. | 427/97 |
| 4,157,407 | 6/1979 | Peiffer | 427/54 |
| 4,268,614 | 5/1981 | Ueyama et al. | 430/315 |
| 4,285,780 | 8/1981 | Schachter | 204/15 |
| 4,341,591 | 7/1982 | Tamutus | 430/312 |
| 4,438,561 | 3/1984 | Mueller | 29/831 |
| 4,447,519 | 5/1984 | Pritikin | 430/312 |
| 4,469,777 | 9/1984 | O'Neil | 430/315 |
| 4,566,186 | 1/1986 | Bauer | 427/97 |
| 4,642,160 | 2/1987 | Burgess | 29/852 |

FOREIGN PATENT DOCUMENTS

| | | |
|---|---|---|
| 1937508 | 2/1971 | Fed. Rep. of Germany. |
| 2387568 | 11/1978 | France. |
| 1577713 | 10/1980 | United Kingdom. |
| 2111313 | 6/1983 | United Kingdom. |

OTHER PUBLICATIONS

IBM Technical Disclosure Bulletin, vol. 23, No. 10, Mar. 1981, W. D. Grobman: "Multilayer Packaging Using Resist Layers", pp. 4751–4752.

IBM Technical Disclosure Bulletin, vol. 8, No. 11, Apr. 1966, M. M. Haddas: "Additive Multilayer Circuit", p. 1482.

Written Opinion, IPEA/U.S., Jan. 25, 1989, in PCT/US86/02710, The Foxboro Company, 3 pages.

Malhotra et al., "Finstrate: A New Concept in VLSI Packaging", Hewlett-Packard Journal, Aug. 1983, vol. 34, No. 8, pp. 1, 2 and 24–26.

Lebow, "A Method of Manufacturing High Density Fine Line Printed Circuit Multilayer Substrates Which Can be Thermally Conductive", CH1568-5/80/10-00-0307, IEEE, 1980, pp. 307–309.

(List continued on next page.)

Primary Examiner—Shrive Beck
Assistant Examiner—Vi Duong Dang
Attorney, Agent, or Firm—Fish & Richardson

[57] ABSTRACT

A process for making additive multilayer circuit boards uses separately designed and fabricated composite structures each consisting of a patterned conductive metal foil supported by a photo-processible insulating film. The composite is bonded foil pattern side down to the substrate or pre-existing multilayer structure and selected areas of the insulating film are removed down to underlying metal sites for electroless plating. All of the apertures in the insulating film are then electrolessly plated full of metal flush to the upper surface. Additional patterned composites are applied and plated up as desired to create blind vias and new conductor patterns layer by layer. In an alternate process a foil clad composite is bonded to an existing substrate foil side up. The insulating layer is selectively etched through windows photoetched in the foil layer. The voids in the insulator layer expose copper sites on the underlying composite. The voids are plated full of metal to form vias and the foil layer is photoetched to make a conductor pattern. The process is repeated to make a multilayer PWB.

23 Claims, 3 Drawing Sheets

OTHER PUBLICATIONS

Product Sheet, Augat Interconnection Systems Pactel Products, "The Advanced Augat/Pactel Substrate", 2 pages.

Product Bulletin, Augat Microtec, Bulletin 102, "Custom Polyimide Multilayer Substrates for Semiconductor Modules", 2 pages.

Product Literature, Additive Products Division, Kollmorgen Corporation, "Add-A-Layer", 6 pages.

Product Brochure, Additive Products Division, Kollmorgen Corporation, "More Circuitry... Less Space", 3 pages.

Product Literature, Additive Products Division, Kollmorgen Corporation, Letter to Prospective Customer.

Product Literature, Additive Products Division, Kollmorgen Corporation, "Additive PDF (High Density) Circuits", Tech Data 1, four pages.

Product Literature, Additive Products Division, Kollmorgen Corporation, "Additive CPF (Precious Metal Replacement) Circuits", Tech Data 2, 2 pages.

Product Literature, Additive Products Division, Kollmorgen Corporation, "Additive PWF (Permanent Wet Film) Circuits", Tech Data 3, 2 pages.

Spitz, "After Subtractive, Semi and Fully Additive Processes", *Circuits Manufacturing*, Jan. 1981, 15 pages.

Company Brochure, Additive Products Division, Kollmorgen Corporation, "We are Pleased to Announce Our New Name", 15 pages.

Tsunetsugu et al., "Multilayer Interconnections Using Polyimide Dielectrics and Aluminum Conductors", The International Journal for Hybrid Microelectronics, vol. 8, No. 2, Jun. 1985.

Muller, "Circuit Board Production with the Additive Process", *Brown Boveri Review*, Apr. 1985, vol. 72, pp. 160-165.

Product Sheet, "Photocircuits Additive: the Electroless Bare-Copper Story", Photocircuits, Riverhead, Kollmorgen Corporation.

"Conformable Release Paper Aids Fabrication of 3-D PC Boards", Electronic Products, pp. 17 and 19, Feb. 15, 1985.

"Additive Process in the U.S.-An Update", *Electronic Packaging & Production*, pp. 54-61, Dec. 1984.

"Additive PCB Technology Announced", *Electri.Onics*, p. 11, Mar. 1985.

"Additive PC Board Technology", *Assembly Engineering*, Mar. 1985.

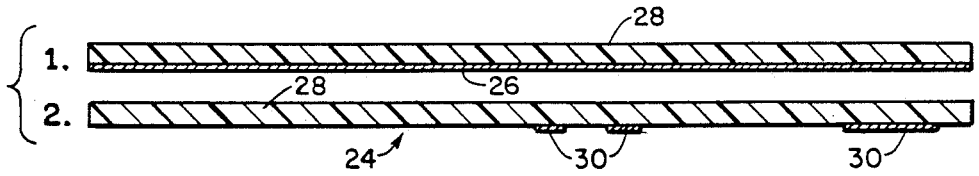
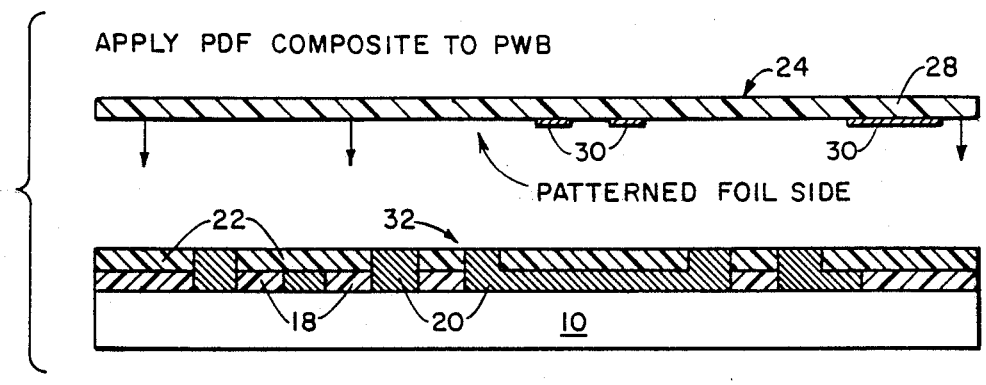
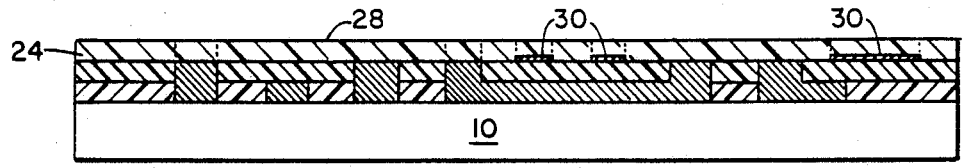
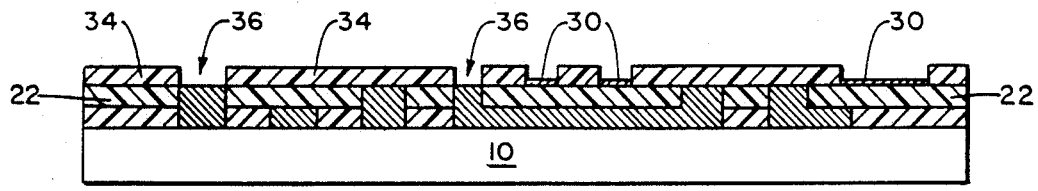
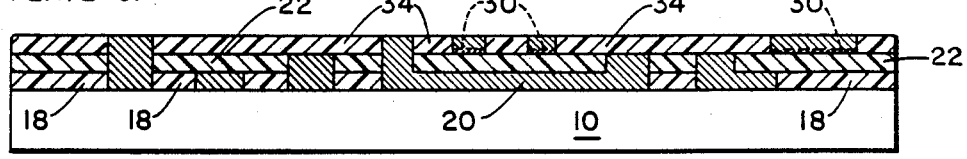
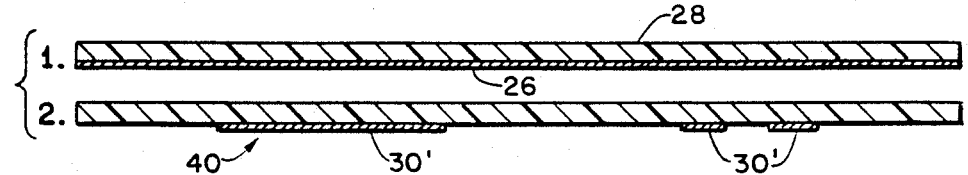

MULTILAYER CIRCUIT BOARD FABRICATION PROCESS

CROSS REFERENCE TO RELATED APPLICATION

The present application is related to our simultaneously filed application U.S. Ser. No. 742,742 entitled "Method of Patterning Resist for Printed Wiring Board", filed, June 10, 1985, assigned to the assignee of the present application, now U.S. Pat. No. 4,666,818 and incorporated herein by reference.

BACKGROUND OF THE INVENTION

This invention relates generally to the manufacture of printed wiring boards and more specifically to the manufacture of multilayered printed wiring boards using generally additive processes.

Ongoing integration and miniaturization of electronic circuit components is challenging the limits of printed circuit board technology. Printed circuit boards or printed wiring boards (PWB), as they are more accurately termed, play several indispensable roles in electronic devices of all kinds. First, the individual electrical components, such as specially packaged integrated circuits, resistors, etc., are mounted or carried on the surface of the flat usually sturdy card-like board. Thus, the PWB serves as a unitary mechanical support for the components. Secondly, using chemically etched or plated conductor patterns on the surface of the board, the PWB forms the desired electrical interconnections between the components. In addition, the PWB often includes metal areas serving as heat sinks for high power or thermally sensitive components. As the use of integrated circuits has grown, the higher density of interconnections has necessitated double-sided PWB's in which additional interconnections are made employing conductor patterns on the other side of the board. This trend has been extended to boards of many layers of interconnections termed multilayer PWB's. Connections from layer to layer are typically made by plated through holes.

Conductor patterns are typically formed by photo-etching a copper foil clad epoxy fiberglass substrate. A photoresist layer is applied to the copper foil and patterned by exposure to ultraviolet light through a stencil-like film artwork mask. Areas exposed on the photoresist are polymerized. The unpolymerized areas are removed by a chemical solution leaving areas of copper, the desired conductor pattern, underneath the protective barrier of the remaining polymerized photoresist. The exposed copper is then etched away and the remaining photoresist is chemically removed to expose the resulting conductor pattern. There are, of course, many popular variations on this procedure, for example, pattern plating where electroplated copper is added through a patterned resist to form the conductors. However, all of those which require etching of the conductor patterns undercut the conductor pattern to varying degrees because only the top surface is protected from the etchant. Undercutting becomes increasingly troublesome when extremely fine conductor lines are required.

Along with increased circuit integration, surface mount technology (SMT) has greatly accelerated the densification of electronic circuitry offering a reduction in space requirements of up to 70%. Surface mount devices (SMD) are applied directly to the surface of the PWB and soldered using vapor phase, solder reflow or other techniques. Registration of surface mounted integrated circuits having many terminals on fine pitch requires extremely fine resolution for the PWB conductors.

At the same time, electroless plating technology has been rapidly improving. In this system, widely used by the Japanese manufacturers on paper laminate substrates, conductor paths are chemically grown by metal deposition in large plating baths. Improved bath formulations and bath operation systems have recently encouraged the use of electroless plating techniques outside Japan. In one process a catalytic substrate is coated with a photoresist. After patterning the resist, the holes through the resist are filled up with metal using electroless plating. Since conductors are produced by the addition of metal rather than by subtraction, i.e., etching, the process is called "additive". Conductor paths can be produced in this manner to a desired thickness. Generally, electroless plating techniques reduce or eliminate the effects of undercutting and produce a straight-sided conductor of virgin metal. However, they have required the use of exotic catalytic materials to promote copper deposition and adhesion.

SMD circuitry, however, has become so dense that multilayer PWB's have become the focus of attention and several competing technologies are evolving. Simple stacks of fiberglass epoxy PWB's can be bonded together and interconnections made by drilled plated through holes. Cofired ceramic technology uses another stacking technique. Potted wire matrices have also been proposed. All of these systems have numerous drawbacks. For example, if layers 2 and 3 in a four-layered PWB require an interlayer connection, a through hole has to be made through the entire structure thus consuming "real estate" on layers 1 and 4 which could otherwise be put to use. So-called blind vias with buried interconnections between two or more internal layers are not well accommodated by existing techniques.

SUMMARY OF THE INVENTION

Accordingly, the general object of the inventions claimed herein is to provide techniques for building multiple layers of conductor circuitry including blind vias and new conductor patterns on a single substrate. A further object is to create a multilayer PWB with blind vias consuming no space n unconnected layers A related object of the invention is to provide an economical process for making complex multilayer PWB's on a single substrate for SMD's.

These and other objects of the invention are achieved by employing a separately fabricated composite structure consisting of a conductive foil clad insulating film. The conductive side is patterned and etched in a separate process. The composite is then bonded foil pattern side down to a substrate or preexisting multilayer structure and selected areas of the insulating film are removed down to underlying metal sites for electroless plating. All of the apertures patterned into the insulating film are electrolessly plated full of virgin metal flush to the upper surface to form conductors and vias. Additional uniquely patterned composites are applied and plated up as desired to form a multilayer structure of practically unlimited complexity including blind vias.

In the preferred process, the insulating film is photo-processable, preferably a permanent dry film (PDF). The metal foil side, preferably copper, may be photoetched in a conventional manner. Since the foil blocks the exposure energy, the uncured PDF is unaffected by the conductor prepatterning operation which takes place "off the board". After the composite is bonded foil pattern side down to the PWB, the PDF is exposed through a mask and removed where desired to expose either the underside of its own cladding or a subjacent area of metal on the preexisting top surface of the PWB. In the latter case any bonding material may be removed as well. The apertures in the PDF are then plated up electrolessly to form conductors and vias. All of the onboard work is accomplished in the additive mode, thus yielding multiplanar conductive paths of continuous virgin metal in finer lines (higher resolution) than reliably attainable by subtractive processes of the prior art. Because electroless plating can begin anew in an area where there was no metal on the multilayer substrate, this technique affords ultimate flexibility in designing circuit patterns independent of the preceding layer. Moreover, the composites can be simultaneously fabricated in parallel assembly systems as subcomponents.

In an alternative technique, also employing foil clad composites, the composite is bonded foil side up (i.e., out) to the preexisting PWB structure. The foil is then resist patterned on board to expose selected interlayer connection areas of the insulating material. An etching process removes exposed insulator material down to underlying metal sites for electroplating or electroless plating. All of the apertures in the insulating material are then plated full of metal up to the outer foil layer, which is then resist patterned a second time to form conductors in the foil layer. Additional foil clad insulator layers are applied to either or both sides of the PWB structure to form blind via interconnected multilayer PWB's of virtually any desired complexity.

BRIEF DESCRIPTION OF THE DRAWINGS

FIG. 2 is a diagrammatic cross-sectional view of the composite before and after patterning the foil cladding for use in the construction of the multilayer circuit board shown in step 7 of FIG. 1.

FIGS. 3-6 are cross-sectional diagrammatic views of the multilayer substrate at distinct points between steps 6 and 8 of FIG. 1.

FIG. 7 is a diagrammatic cross-sectional view of another composite before and after patterning the foil cladding for use in the construction of the multilayer circuit board shown in step 8 of FIG. 1.

DETAILED DESCRIPTION

The following description discloses multilayer PWB processes in which extremely dense complex independent layers can be built up on a conventional substrate using chemical plating in large continuously running, state of the art plating baths, which accommodate large numbers of circuit boards at one time. The entire process can be as highly automated as desired with composite production proceeding independently. The processes will prove to be not only versatile but also highly economical compared to competitive techniques.

Figure 1:
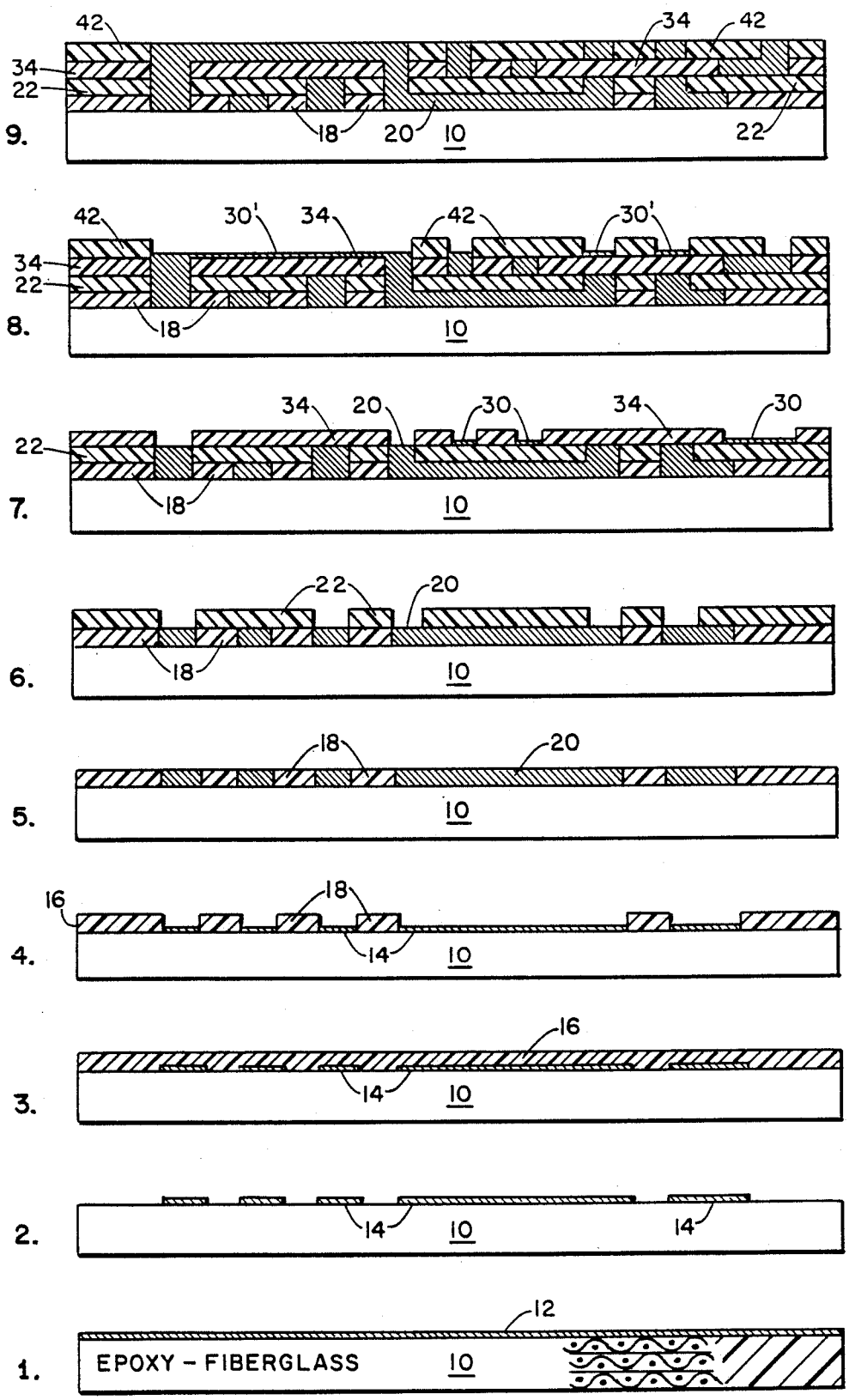
FIG. 1 is a diagrammatic cross-sectional view of the sequential construction of a multilayer circuit board fabricated using the method of the present invention.

FIG. 1 shows nine phases of construction of a representative multilayer PWB in cross-section. The extent of a given conductor path in the plane of a given layer is omitted for ease of illustration as the conductor pattern in any given plane can be extremely complex. The metal regions in a given layer exposed in the cross-section as viewed in FIG. 1 may correspond solely to a vertical interconnection spot between two layers or it may be a slice through a conductor running, for example, perpendicular or skewed to the paper in the plane of the layer. Steps 1 through 5 illustrate electroless plating through a permanent dry film to create a single coplanar, conductor layer. Two different composites are added in steps 7 and 8, respectively. The details of the steps leading up to step 8 of FIG. 1 are shown specifically in FIGS. 3-6.

In step 1, a substrate 10 is overlaid with a conductive metal foil 12. The substrate may be a sheet fabricated from any insulating material such as synthetic resins, glass, ceramic, ceramic coated metal, paper laminate, cardboard, or fiber. Examples of synthetic resins include phenol-formaldehyde, melamine, and epoxy. The preferred substrate is an epoxy-fiberglass composite.

The conductive metal foil 12 is selected from those metals which have the desired electrical and mechanical properties and chemical and heat resistance. The preferred metal for the foil 12 is copper, typically having a thickness of about one-half to three mils.

In step 2, the metal foil 12 is patterned to form conductive traces 14. A photoresist (not shown) can be applied to the foil 12, and exposed through a mask. Next, the exposed photoresist is removed and underlying metal etched to leave the desired metal circuit pattern traces 14. The photoresist composition is typically applied in the form of a dry film layer using a conventional lamination or spun-on procedure employing a liquid resist. The resist can be patterned by exposure to ultraviolet (UV) radiation through an artwork mask, or directly with an electron beam, or a laser. Another method of patterning the metal foil is taught in our above-referenced copending application. Because the traces 14 are not intended to constitute finished conductors in and of themselves, the foil 12 is preferably very thin to allow high resolution fine line patterning without undercutting problems which occur in subtractive techniques with thicker layers.

In step 3 of FIG. 1, the conductive pattern 14 formed in the metal foil 12 is overlaid with a photo-processible insulating material 16, preferably a photo-hardenable dielectric film. The insulating material 16 is preferably uncured PDF applied in the form of a dry layer using a lamination procedure.

The preferred PDF material is designated PAR-001, a UV curing polyacrylonitrile in precision thicknesses from E.I. DuPont de Nemours & Co. An undesirable property of this material is that it will not stick well to copper. Thus, a more widely used and commonly available form of PDF contains adhesion promoters for copper, making the material suitable for use as a solder mask, for example, or other types of patterned insulator applications. A disadvantage of the more commonly known form of PDF is that it is impractical to use as a plating mask. In particular, the copper adhesion promotion agent leaches out into the bath and "kills the bath" after an unacceptably short period. PAR-001 PDF, used in the present invention, comes without the copper adhesion promoters and, therefore, may be used as a plating mask without poisoning the bath. However, it does not stick well to copper after curing. The uncured PDF is flexible and slightly tacky and it will adhere temporarily to copper. Uncured PDF laminated to a non copper substrate becomes permanently bonded to the substrate material (in this case epoxy) upon curing.

In step 4, the PDF 16 is patterned by exposure to UV through a mask outlining the desired conductor pattern. The mask will be an identical negative of the photoresist mask of step 2. The exposed areas 18 polymerize, harden and remain, as shown in step 4. The areas between hardened PDF 18 are chemically removed to form voids or apertures through which the underlying copper traces 14 are exposed. The apertures thus expose copper sites for electroless plating. The exposed copper traces serve as catalytic sites for which the copper ions in a bath solution have an affinity. The metal "grows" in thickness by chemical accretion until all of the apertures are filled or "plated up" with pure copper 20 flush with the upper surface as shown in step 5.

In steps 1-5 as shown in FIG. 1, the problem of the PDF plating mask not adhering to copper is not encountered since all of the copper traces 14 in the entire layer are exposed for plating. The only layer to layer interface left after step 4 is between the PDF and the epoxy substrate. Thus, after curing, the PDF is permanently bonded to the substrate 10 with embedded plated conductors terminates or based upon the original copper traces 14 which in turn are themselves bonded to the substrate 10.

As shown in step 6 in FIG. 1, a second PDF layer is applied and processed to leave permanent insulator pattern 22. Note that apertures are formed over pre-existing metal. However, in this case, certain metal conductor areas are not exposed but covered by the PDF 22.

Because there is a copper/PDF layer-to-layer interface in step 6 where a copper conductor is "left off" in the preexisting layer, the adhesion problem must be addressed. As it turns out, PDF will adhere naturally to tin quite well. Accordingly, one technique for enabling PDF adhesion is to cover the exposed surfaces of the metal conductors 20 in step 5 with tin. This can be accomplished by an immersion tin coating step before laminating uncured PDF. Immersion tin coating is used as a flash coat to promote soldering in other processes. The resulting coating is very thin, on the order of several Angstroms, but perfectly suited as a liason between the copper and PDF. Another technique, electroless tin plating, of the pre-existing panel of step 5 would also suffice.

After laminating and patterning the PDF 22, the exposed metal sites 20 need to be plated. Electroless plating of copper, a more noble metal, onto tin being difficult, it is considered preferable to first use a tin stripping bath to remove the ultra-thin exposed tin coating before plating. The exposed copper is then electrolessly plated through the voids in the PDF as in steps 4 and 5. The resulting structure is shown in FIG. 3.

To add new independent circuit conductor patterns where there is no underlying metal, a "composite" 24 shown in FIG. 2 is fabricated in a separate "off-board" procedure. A very thin copper foil cladding layer 26 (half ounce copper foil about half mil thick) is laminated by hot rolling onto one side of an uncured PDF sheet 28. The foil side is then photopatterned to create a thin conductor pattern trace 30. The thinness of the foil enables very fine lines to be etched The metal foil 26 is photoetched using conventional techniques such as application of a UV photoresist, exposure to actinic UV radiation, stripping of the exposed areas with subsequent etching of the underlying foil, and removal of the unexposed resist. The metal foil 26 acts as a shield for the photosensitive PDF 28 so that the PDF is undisturbed (i.e., left unpolymerized) by the conductor patterning.

Next, the composite 24, still bearing uncured PDF, is bonded foil pattern side down to the top surface 32 of the multilayer substrate, as depicted in FIG. 3. However, first, a double-sided free film adhesive is applied to the pre-existing substrate surface 32. Acrylic film adhesives are available in 1, 2 or 3 mil thicknesses sandwiched between peelable carriers. After bonding the composite to the substrate, the PDF 28 is then photo-processed to leave hardened insulator pattern 34, as shown in FIGS. 4 and 5. FIG. 5 corresponds to step 7 of the entire sequence outlined in FIG. 1. Everywhere copper foil traces are present on the underside of the composite, the overlying PDF is apertured to leave holes and channels to build up vias and conductors. The foil traces are catalytic sites or seeds for plating. Thus, the foil/PDF bond is only temporary and not a problem in the uncured PDF state In addition, where metal areas on the substrate surface 32 are to be plated through the new layer, they are exposed through apertures in the PDF. The same solvent (e.g., 1, 1, 1 trichloroethane) removes unpolymerized PDF and acrylic film. Then, the copper-bottomed voided apertures are electrolessly plated up, as shown in FIG. 6.

The PDF patterning and plating operations shown in FIGS. 5 and 6 are similar to steps 4 and 5 of FIG. 1. However, some of the starting points for plating, i.e., the copper sites 30 shown in FIG. 5 are decidedly different from the pre-existing copper sites used exclusively in steps 4 and 6, for example, of FIG. 1. Sites 30 in FIG. 5 are indeed the underside of the foil cladding layer 26 (FIG. 2) in which the conductor trace pattern 30 was formed. These extremely thin foil conductors 30 on the composite form new sites for electroless plating in regions where there is no underlying metal in the preceding layer. The hardened PDF insulator layer 22 and acrylic adhesive film lie beneath the foil sites 30. Note that the PDF of the composite may be removed in areas 36 not coinciding with its own clad conductor pattern so as to plate connections to the subjacent layer. Thus, the use of the composite allows flexibility in plating up over existing or new metal. In addition, some conductors exposed in surface 32 of the pre-existing substrate will be left off, i.e., not connected electrically to the new layer. Thus, the acrylic film adhesive layer between composite and substrate solves two different problems: it not only bonds the traces on the bottom of the composite to the underlying cured PDF on surface 32 of the substrate, but also bonds the exposed copper conductors being left off to the uncured PDF of the composite.

Note that, while the same acrylic adhesive film technique could be used in steps 1-5 of FIG. 1 instead of tin coating the conductive pattern, it is good to minimize the number of adhesive film layers because they may not be as temperature stable as the PDF. Thus, where PDF alone (i.e., non-composite) is added, tin coating of underlying copper is preferred.

FIG. 6 corresponds to step 8 of FIG. 1 before the addition of the next layer. After the process shown in FIG. 6 in which the apertures are plated flush with the top surface of the growing multilayer structure, either PDF alone (like steps 3–5) as in step 6 of FIG. 1 or another composite as in FIG. 7 in step 7 of FIG. 1 can be added. FIG. 7 shows a second composite 40 on which a distinct conductor pattern 30' is formed in a manner identical to that of FIG. 2. The composite 40 is bonded foil side down and the PDF is photoprocessed as desired to leave the configuration shown in step 8 of FIG. 1 using a procedure identical to that described above and illustrated in FIGS. 3, 4 and 5. The remaining hardened PDF 42 leaves apertures over old and new metal, the new metal being provided by the clad pattern 30'. The apertures are plated up from the copper sites flush with the top surface as shown in step 9 of FIG. 1 to complete the multilayer structure in this illustration. Surface mounted components would be attached directly to the top conductor surface. A solder mask (not shown) could be applied to protect surface conductors, leaving only those exposed sites necessary for component attachment. These sites would then be solder coated.

Steps 3 to 5 and 7 to 9 of FIG. 1 may be alternated or repeated as necessary to create a particular multilayer PWB.

Although the composites are described as applied to a pre-existing multilayer substrate, the composite could just as easily be applied as the first circuit layer on an insulating substrate such as epoxy-glass board. Additional composites and insulating layers could then be added as desired.

A key feature of this method is the flexibility of being able to design any conductive metal pattern 30 and 30' without the difficulties of working directly on top of the multilayer structure. For example, development methods may be used which are incompatible with the already constructed multilayered substrate. Also, a number of circuits may be prepared simultaneously or in advance to minimize the actual assembly time.

The process which utilizes a photo-processible insulating material and patterned conductive foil composite has the following additional advantages over the prior art methods: (1) the patterned copper foil forms a conductive circuit which can be directly applied to the multilayer board without further plating or etching; (2) no embedded conductor wires are required; (3) the composite forms vertical connections and blind vias without drilling and plating of holes in multiple insulating layers, and (4) the on-board process is fully additive, with improved conductor resolution, delineation and shape. The resulting conductive paths are formed of continuous virgin metal. The reduction of processing steps and the ability to metallize substrate conductors simply by immersion in an electroless plating tank allows additive circuit boards to be made in higher volumes with batch processing at lower costs than with conventional processes. Further, electroless plating provides a means for fabricating higher density boards with deep, small diameter vias (high aspect ratio), unlike with semi-additive processes or processes utilizing electroplating techniques.

One of the disadvantages inherent in the foregoing technique illustrated in FIGS. 1–7 is the need to take into account the dimensional stability of the patterned foil composite when registering it on the existing multilayer PWB surface since the uncured PDF is soft and may stretch slightly. In addition, non-copper adherent, bath compatible PDF requires extra adhesive or tin plating steps. While these disadvantages of the foregoing process are greatly outweighed by its advantages, these specific disadvantages are avoided altogether in an alternative technique shown in detail in FIG. 8, which uses an etchable foil clad insulating material rather than photoprocessable PDF insulator.

Figure 8:
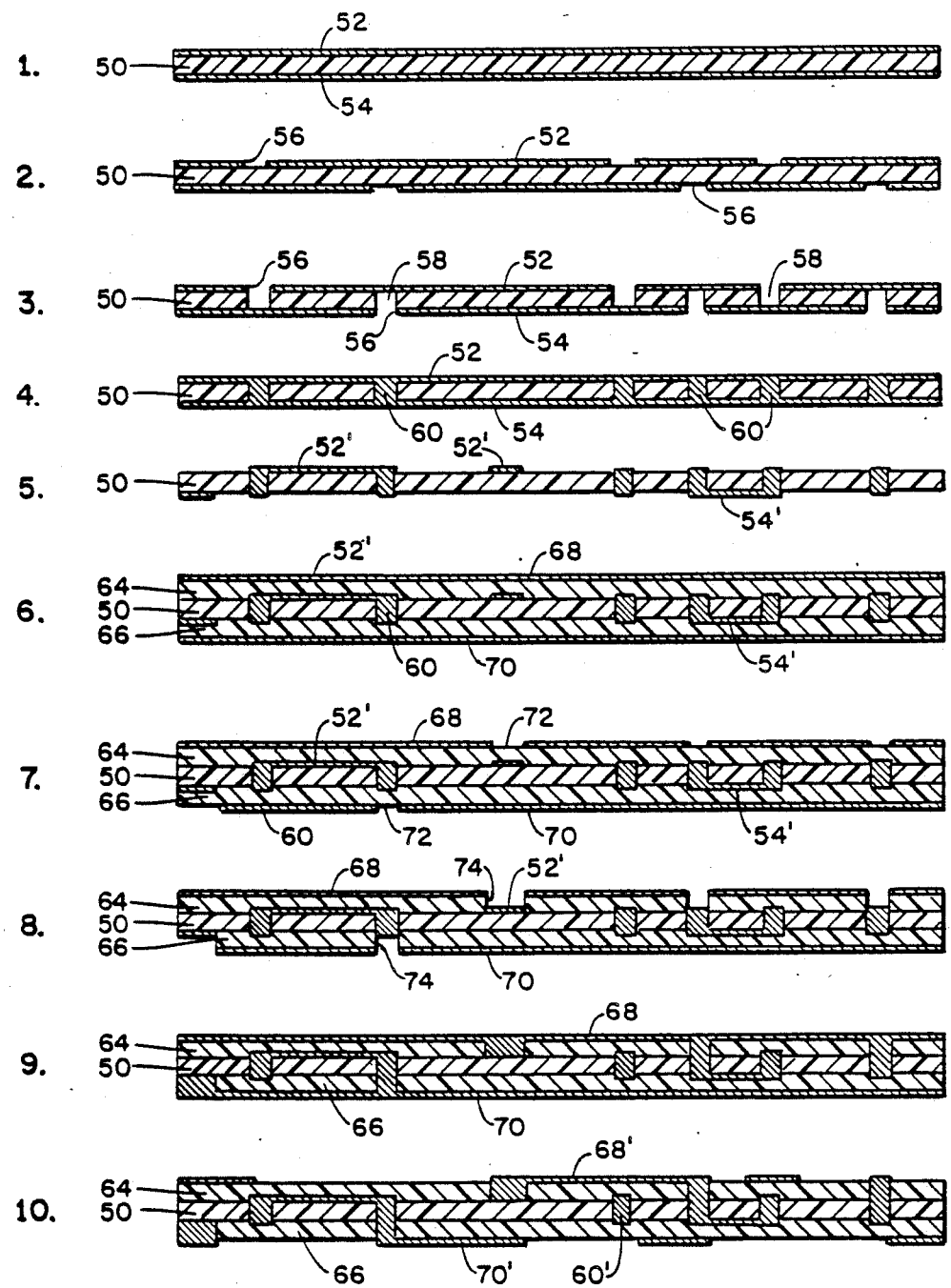
FIG. 8 is a sequential schematic representation of an alternative method of making a multilayer PWB using foil clad composites.

The method starts with an insulating material 50 copper foil clad on both sides (step 1, FIG. 8). The outer foil layers 52 and 54 are etched by resist methods to form apertures or micro-holes 56 in the foil, exposing the insulating material selectively. The holes 56 are not conductor patterns, but tiny windows or ports into the insulator body 50 (step 2).

The outer foil layers 52 and 54 serve as a resist mask for etching of the insulation layer 50. The insulator 50 is exposed through the apertures 56 to the etchant by any one of several methods from one foil layer to the other. Suitable means of polymer insulation etching are various wet chemistries, plasma or "dry" etching, or an appropriate laser energy. The foil layers 52 and 54 protect the underlying insulator from the etching process thus allowing the insulator to be selectively apertured forming holes or voids 58 in the insulator from each window 56 in the foil to the underlying foil layer on the other side of the composite.

Next, the voids 58 in the insulator 50 are filled with metal as shown in step 4 thus forming interconnection posts or vias 60 between the foil layers 52 and 54. Since the vias 60 go all the way through from one layer to the other, it does not make any difference whether the windows are formed in one side or the other or both sides as shown in steps 2 and 3. In any case, the voids 58 are filled by means of metal plating. Electroless plating can be used or, because the foil 52 and 54 is intact (i.e., unpatterned), electroplating can be used after electrolessly plating a thin starter layer on the walls of the voids 58, a standard process for plating through holes. The sensitized electroless followed by electroplating technique involves applying a catalytic sensitizing solution to the insides of the voids to form catalytic sites for electroless plating of a thin layer of copper. Once plated, the thin layer of copper in the holes forms a continuous electrical conductor to the outer foil surfaces thus allowing the remainder of the plating to be done by the faster electroplating method. Electroplating high aspect ratio holes is difficult. However, the voids in the very thin insulators of FIG. 1 could have relatively low aspect ratios in which case electroplating may be possible. In any event, it may be desirable to take advantage of any number of techniques known to enhance the electroplating of holes such as pulse plating, mechanical agitation and air sparging. A typical hole or window would be on the order of 4 mils wide. Ideally, the outer insulator layers would be on the order of 1 to 2 mils thick so that the aspect ratio of the insulator voids would be about 2 to facilitate plating.

Next, the outer foil layers 52 and 54 are re-etched into conductor patterns 52' and 54' by conventional techniques or by the resist patterning method shown in our above-referenced copending application. Patterning of the foil leaves a double-sided conductor pattern to which additional layers may be added by bonding foil clad (one side only) insulating material to either or both sides with the foil side out. Step 6 of FIG. 8 shows a double-sided approach in which insulation layers 64 and 66 are bonded to the structure of step 5 with their foil cladding layers 68 and 70 on the outside. As shown in step 7, the foil cladding layers 68 and 70 are etched to form apertures 72 aligned with underlying copper sites on the two layer conductor pattern formed on the surfaces of the original insulator layer 50. The exposed insulating material is again etched away by any of the previously mentioned techniques, except that two different insulating layers 64 and 66 are being apertured. As shown in step 8 of FIG. 8, the resulting voids 74 are then plated full with metal, connecting the underlying sites such as 52' to the outer foil layers as shown in step 9. Again, plating can be solely electroless or sensitized electroless followed by electroplating.

The foregoing process of FIG. 8 lends itself to a great variety of material systems. For example, the bonding of foil clad insulating layers can be achieved by the use of adhesives as in the method of FIG. 1, or by the use of a thermoset or thermoplastic insulating material with its own adhesive properties, in a press or roll bonding operation Very thin materials are also particularly suited for this invention. An example would be to use thin (0.001–0.002 inch) thermoplastic (e.g., Du Pont Teflon FEP) sheets and simultaneously hot roll bond the outer foil layers and insulating sheets to a "core" structure, which could be a conventional rigid double-sided board (PTH type) or a thin flexible core such as polyimide, fabricated as described above The dimensional stability of the core structure must be taken into consideration when thermoplastic insulators are used and in this case, a Teflon thermoplastic core would be avoided.

The resulting structure in step 10 of FIG. 8 shows a multilayer PWB having four conductor layers and three insulator layers. The middle insulator layer 50 should be of a material whose dimensional stability is suitable for the application. A particularly desirable combination may be to use a polyimide Kapton material from DuPont for core 50 with Teflon layers for the insulators 64 and 66. After step 10 in FIG. 8 if additional layers are not needed, the exposed bare copper conductors on the surface would be covered with a solder mask which would expose terminals as needed for SMD attachment. These sites would then be solder coated.

Etching of polymeric insulators such as Kapton or Teflon using either dry glow discharge plasmas or wet chemical etchants are preferred over laser beam etching for complex circuit patterns. As laser etching is not a "batch process", each via would have to be formed individually, one layer at a time. For Teflon, many plasmas etch rapidly. For adhesive bonded polyimide, an alcoholic potassium hydroxide solution (KOH) is suitable, with either spray or immersion etching techniques.

Plating of the via sites can be achieved by numerous methods and with many variations. For example, the entire outer foil layers can be overplated to a given thickness simultaneously with the via sites. In another variation, a resist mask can be applied to the outer foil layers prior to plating, so that only the desired conductor patterns are overplated, or only the vias are plated. Because the outer foil layers are continuous, electroplated metals can be used for etch resists on the outer layers, such as a tin lead alloy plated selectively through a photoresist mask over the copper foil conductor pattern, which would then serve as an etch resist during the removal of the background copper. A similar technique is discussed in our copending resist patterning method application referred to above.

The method of FIG. 8 offers advantages in terms of materials and ease of registration while allowing ultimate complexity in conductor patterns including blind vias. As the vias themselves are not photoprocessed, but formed by etching through a foil mask, the choice of insulating materials is not restricted to photoreactive polymers. While permanent dry films cure brittle, flexible thermoplastics can be used for the insulator layers in the method of FIG. 8. However, despite the dimensional instability of the insulator layers made of Teflon, for example, using them in connection with a stable core material and patterning all of the conductors in an on board process facilitates registration. If adhesive materials are needed for bonding the insulator layers, many would be compatible with the process of FIG. 8. For example, acrylic adhesive could be used and would be susceptible to a plasma etching for removal down to the copper sites. The stable core structure of a multilayer PWB could be provided by conventional PWB technologies such as a double-sided PTH board made by additive, semi-additive or pattern plating processes. Instead of solder masking the outer layers, the multilayering would begin by applying foil-clad insulator sheets to the conductor patterned surfaces of the core to form a structure like that shown in step 6 of FIG. 8 except that the inner core vias would be by means of PTH's.

A typical multilayer PWB has an inner core of two insulated layers, one being the voltage layer and the other being the ground layer in order to achieve higher capacitance. The signal layers would be formed on outer layers of the PWB. A particularly advantageous system would be to standardize inner cores carrying the voltage and ground layers for a variety of circuits. That is, the voltage and ground plane layers would have a sufficient number and variety of locations of through-connections to service a variety of circuits. A standardized voltage ground plane structure would provide fast turnaround for testing prototypes of complex circuits in a multilayer PWB format.

Another possible insulator material application system for the process of FIG. 8 would be to use a mesh or screen of glass, for example, impregnated with Teflon or another thermoplastic or thermoset resin. The mesh or screen is used not only to enhance the dimensional stability of the plastic, but also to enable precise thicknesses to be attained. Using an epoxy fiberglass board as the insulating layer is another possibility. While a plasma etch would clean the plastic from the glass cloth, consideration would have to be given to the desirability of plating through the glass cloth.

Other variations and modifications of this method for producing multilayer circuit boards will occur to those skilled in the art from the foregoing detailed description and accompanying drawings without departing from the principles and spirit of the invention. For example, although the method of FIG. 1 is illustrated in the fabrication of a single-sided multilayer PWB, it is possible and no doubt preferable in many instances to apply the method of FIG. 1 in the manufacture of a double-sided board by layering both sides at once in a manner analogous to that shown in the double-sided illustration of the alternate method of FIG. 8. In addition, while the alternative methods of FIGS. 1 and 8 emphasize the preference for photoprocessable insulator in one case and non-photoprocessable insulator in the other, a non-photoprocessable insulating layer can be used for the preparation of the composite 24 in FIG. 2 of the method of FIG. 1 by cutting apertures in the insulator directly by a laser beam, for example, which would be reflected by the underlying metal sites on the existing multilayer PWB structure. The disadvantage is that it is not a "batch process", but requires directed energy. Such modifications are, however, intended to fall within the scope of the appended claims.

What is claimed is:

1. A method of fabricating an electrical interconnection board, comprising
   defining a conductive metal pattern on one side of a permanent insulating film layer,
   applying said insulating layer to a metal conductor bearing substrate with the conductive pattern side down adjacent to said substrate surface,
   aperturing said insulating layer in a predetermined pattern so as to expose underlying metal sites, and
   plating up with metal from said exposed metal sites to fill the apertures in said insulating layer to form solid conductors and interlayer vias.

2. The process of claim 1, wherein the step of aperturing said insulating layer includes aperturing said insulating layer to form voids therein down to the conductive pattern borne by said insulating layer as well as to metal sites on said substrate.

3. A method of fabricating an electrical interconnection board, comprising
   preparing a composite of patternable insulating film clad on one side with a patternable electrolessly platable metal foil,
   removing portions of said foil to define a conductor pattern on said composite,
   applying said composite to a pre-existing substrate conductor pattern side down,
   removing selected portions of said film to form voided apertures revealing the underside of at least a portion of said clad conductor pattern as catalytic plating sites, and
   electrolessly plating up the voided apertures full of metal.

4. The method of claim 3, further comprising
   repeating the recited steps to construct multiple composite-based layers.

5. The method of claim 3, wherein said insulating film is photoprocessable and said removing step for said film is accomplished by photoprocessing said film.

6. The method of claim 5, wherein said insulating film is uncured permanent dry film.

7. The method of claim 6, wherein said metal is copper and said permanent dry film is substantially free of copper adhesion promotion agents to avoid poisoning the bath used in said electroless plating step.

8. The method of claim 7, wherein said composite applying step includes applying an adhesive layer between said substrate and said composite.

9. The method of claim 8, wherein said adhesive layer is formed of a material which is removable along with portions of said film to form said voided apertures.

10. The method of claim 3, wherein said foil removing step includes using a photoresist to define said conductor pattern.

11. The method of claim 3, further comprising
    first preparing a substrate having metal conductors exposed on the surface of the substrate,
    and wherein the step of removing selected portions of said film reveals the underside of all of said clad foil pattern and at least some sites on the metal conductors on the substrate surface.

12. The method of claim 11, wherein said applying step includes bonding said composite to the substrate with a layer of adhesive material.

13. A method of fabricating an electrical interconnection board comprising
    applying a conductive metal foil to an unreacted photoprocessible insulating material,
    patterning the metal foil by a method wherein the unreacted insulating material is shielded by the metal foil, and
    applying the insulating material-patterned metal foil composite to a substrate with the patterned metal foil adjacent the substrate.

14. A method of making a circuit board comprising
    preparing a composite consisting of a sheet of insulating material bearing an already patterned conductive metal layer,
    applying said composite to a substrate, and
    patterning only said sheet of insulating material after application of the composite to the substrate.

15. A method of making a circuit board comprising
    preparing a composite consisting of a sheet of unreacted photoprocessible insulating material bearing an already patterned conductive metal layer,
    applying said composite to a substrate, and
    patterning said sheet of insulating material by photoprocessing after application of the composite to the substrate.

16. A method of making a circuit board comprising
    preparing a composite consisting of a sheet of insulating material bearing an already patterned conductive metal layer,
    applying said composite to a substrate,
    patterning said sheet of insulating material after application of the composite to the substrate, and
    electrolessly plating through the patterned insulating material from underlying copper sites on said substrate.

17. A method of fabricating multilayer circuit boards comprising:
    (1) applying a conductive metal foil to an insulating substrate,
    (2) patterning the conductive metal foil,
    (3) applying a photo-processible insulating material to the patterned metal foil,
    (4) patterning the insulating material to form voids therein exposing areas of the underlying patterned metal foil,
    (5) electrolessly plating the exposed conductive metal through said voids up to the surface of said insulating material, and
    (6) applying and patterning additional layers of photo-processible insulating material and electrolessly plating the conductive metal exposed by the photo-processing of the insulating material to form vertical connections,
    (7) preparing a composite of a photo-processible insulating material clad on one side with a conductive metal foil, wherein the foil is patterned to form a conductive metal circuit and wherein the insulating material is shielded from the patterning process by the foil,
    (8) bonding the patterned metal circuit side of the composite to the top layer of electrolessly plated-patterned insulating material on the substrate,
    (9) patterning the insulating material of the composite and electrolessly plating the exposed conductive metal to form a level surface, and
    (10) alternating step 6 with steps 7 to 9 to form a multilayer circuit board.

18. The method of claim 17 further comprising selecting the insulating material from the group consisting of those materials which can be electrolessly plated with a conductive metal solution without addition of catalytic sites.

19. The method of claim 17 further comprising treating the insulating material to form catalytic sites for subsequent electroless plating with a conductive metal solution.

20. The method of claim 17 further comprising patterning the conductive metal foil by applying a photoresist, exposing the photoresist through a mask, and etching the photoresist and exposed underlying metal foil to form a circuit pattern.

21. The method of claim 17 wherein said metal is copper and further comprising tin coating the patterned foil before step (3).

22. The method of claim 17 wherein the bonding step (8) is accomplished by applying an adhesive film layer between the substrate and the composite.

23. The method of claim 17 further comprising patterning the insulating material with a laser beam.

* * * * *

UNITED STATES PATENT AND TRADEMARK OFFICE
CERTIFICATE OF CORRECTION

PATENT NO. : 4,915,983

DATED : April 10, 1990

INVENTOR(S) : Harold Lake and Paul E. Grandmont

It is certified that error appears in the above-identified patent and that said Letters Patent are hereby corrected as shown below:

Column 1, lines 21-22, in the Background of the Invention, "circuit board technology. Printed circuit boards or printed wiring boards (PWB), as they are more accu-" should be -- circuit board technology. Printed wiring boards (PWB), as they are more accu- --.

Column 2, line 48, in the Summary of the Invention, "vias consuming no space n unconnected layers A re-" should be -- vias consuming no space in unconnected layers. A re- --.

Column 6, line 24, in the Detailed Description, "in the uncured PDF state In addition, where metal areas" should be --in the uncured PDF state. In addition, where metal areas--.

Column 9, line 16, in the Detailed Description, "operation Very thin materials are also particularly" should be --operation. Very thin materials are also particularly--.

Column 9, line 23, in the Detailed Description, "polyimide, fabricated as described above The dimen-" should be --polyimide, fabricated as described above. The dimen- --.

Signed and Sealed this

Twelfth Day of November, 1991

Attest:

HARRY F. MANBECK, JR.

Attesting Officer

Commissioner of Patents and Trademarks